United States Patent [19]

Hansen

[11] Patent Number: 4,903,332

[45] Date of Patent: Feb. 20, 1990

[54] FILTER AND DEMODULATION CIRCUIT FOR FILTERING AN INTERMEDIATE FREQUENCY MODULATED SIGNAL CARRYING A MODULATION SIGNAL

[75] Inventor: Jens Hansen, Berlin, Fed. Rep. of Germany

[73] Assignee: H.u.C. Elecktronik GmbH, Berlin, Fed. Rep. of Germany

[21] Appl. No.: 163,272

[22] Filed: Mar. 2, 1988

Related U.S. Application Data

[63] Continuation-in-part of Ser. No. 881,470, Jun. 13, 1986, abandoned.

[30] Foreign Application Priority Data

Oct. 16, 1984 [DE] Fed. Rep. of Germany ....... 3438286

[51] Int. Cl.$^4$ ............................................ H04B 1/16
[52] U.S. Cl. ............................. 455/209; 455/312; 455/337; 455/340; 329/315
[58] Field of Search ............... 455/205, 207, 208, 209, 455/312, 337, 214, 306, 318, 332, 340; 329/50, 112, 122, 132, 136, 124

[56] References Cited

U.S. PATENT DOCUMENTS

| | | | |
|---|---|---|---|
| 2,262,945 | 11/1941 | Kircher | 455/209 |
| 3,150,323 | 9/1964 | Stavis et al. | |
| 3,329,900 | 7/1967 | Graves | |
| 3,428,900 | 2/1969 | Newton | 455/209 |
| 3,568,066 | 3/1971 | Fujimura | 455/209 |
| 3,614,627 | 10/1971 | Runyan | 455/208 |
| 3,626,301 | 12/1971 | Develet, Jr. | |
| 3,798,550 | 3/1974 | Takaoka | |
| 3,922,609 | 11/1975 | Grohmann | |
| 3,936,753 | 2/1976 | Clark | |
| 3,961,262 | 6/1976 | Gassmann | 455/207 |
| 4,091,410 | 5/1978 | Citta | 455/337 |
| 4,156,255 | 5/1979 | Hongu et al. | 455/337 |
| 4,263,675 | 4/1981 | Hongri et al. | 455/192 |
| 4,293,818 | 10/1981 | Jarger | 329/50 |
| 4,435,843 | 3/1984 | Eilers et al. | 455/205 |
| 4,569,085 | 2/1986 | Nolde et al. | 455/208 |
| 4,605,904 | 8/1986 | Haji-Chehade | 455/312 |
| 4,653,117 | 8/1987 | Heck | 455/209 |
| 4,658,438 | 4/1987 | Kamata et al. | 455/264 |
| 4,761,829 | 8/1988 | Lynk, Jr. et al. | 455/312 |
| 4,776,039 | 10/1988 | Akaiwa | 455/205 |

FOREIGN PATENT DOCUMENTS

| | | |
|---|---|---|
| 0075071 | 3/1983 | European Pat. Off. . |
| 3048263 | 7/1982 | Fed. Rep. of Germany . |
| 3147493 | 6/1983 | Fed. Rep. of Germany . |

*Primary Examiner*—Robert L. Griffin
*Assistant Examiner*—Curtis Kuntz
*Attorney, Agent, or Firm*—Basile and Hanlon

[57] ABSTRACT

Intermediate frequency signals are produced by mixing with an oscillator voltage and subsequently filtered and demodulated. The oscillator voltage or the resonance frequency of the filter or filters are followed up by a control voltage derived from the demodulated signal corresponding to the intermediate frequency. The perturbatory phase modulator occurring as a result of the control lag is compensated by opposite-phase phase-modulation which is superimposed on the intermediate frequency. In this, the phase modulation is achieved by a phase modulator which is connected with the output of a demodulator by a matching circuit. Another possibility for achieving phase modulation of the intermeidate frequency is to modulate the oscillator of the mixing stage.

4 Claims, 2 Drawing Sheets ent application Ser. No. 06/881,470, filed on June 13, 1986, now abandoned, and is related to U.S. patent application Ser. No. 07/116,567, filed on Oct. 23, 1987 still pending.

FILTER AND DEMODULATION CIRCUIT FOR FILTERING AN INTERMEDIATE FREQUENCY MODULATED SIGNAL CARRYING A MODULATION SIGNAL

CROSS REFERENCE TO CO-PENDING APPLICATIONS

This application is a continuation-in-part of U.S. patent application Ser. No. 06/881,470, filed on June 13, 1986, now abandoned, and is related to U.S. patent application Ser. No. 07/116,567, filed on Oct. 23, 1987 still pending.

BACKGROUND OF THE INVENTION

Field of the Invention

The invention relates to a process and to a circuit arrangement for converting frequency-modulated signals through at least one intermediate frequency into low frequency signals.

Background of the Invention

West German Application DE-OS 30 48 263 describes a radio receiver, which is provided with an on-line filter arrangement. The signal received is converted by means of one or more mixer stages into intermediate frequency signals, which are passed via intermediate frequency filters to a demodulator in which they are converted into low frequency signals. To keep interference as low as possible, the filters have a narrow band construction, in which a follow-up voltage derived from the demodulator output voltage displaces the resonant frequency of the narrow band intermediate frequency filter connected upstream of the demodulator in such a way that the instantaneous value of the intermediate frequency is always within the band pass range of the filter.

In addition, a circuit arrangement for converting frequency-modulated signals into low frequency signals is known in which the oscillator for the mixer stage is followed up in an in-phase manner with the intermediate frequency by a voltage derived from the low frequency output voltage of the demodulator. Thus, the frequency deviation of the signal at the mixer stage output is greatly reduced, so that narrow band selective filters can be used as intermediate frequency filters.

As the generation of the control voltage takes place in time after mixing and selection, the reverse control leads to control delays, which essentially result from the group delays of the filters. Admittedly, the noise and interference suppression of the incoming signal increases with the rising narrow bandedness, but there is also an increase in the group delay or lag. This means that the control voltage and the intermediate frequency voltage undergo a time shift and there is a relative movement between the filter or oscillator and the intermediate frequency. The greater the time change to the intermediate frequency, the higher the relative movement. In addition, due to the phase angle between the control voltage and the intermediate frequency movement, the intermediate frequency is modulated in the phase and the spurious modulation is superimposed on the useful frequency modulation. The degree of spurious modulation is proportional to the time change of the intermediate frequency and consequently increases with rising frequency. Thus, in the higher low frequency range there is an amplitude increase, which in turn leads to a rise in the relative movement and therefore the interfering phase modulation. As a result of this positive feedback with a tendency to oscillate, the follow-up possibility of the filter or oscillator is greatly reduced.

Therefore, the problem of the present invention is to provide a process and a circuit arrangement for converting frequency-modulated signals through at least one intermediate frequency into low frequency signals in which the relative movement and interfering phase modulation in the higher low frequency range is kept low when using narrow band filters so that the filters or oscillator can satisfactorily follow the mixer stage.

This problem which is in itself novel and has resulted from serious consideration, is solved according to the invention.

As a result of the additional modulation of the intermediate frequency, which is in phase opposition to the interfering phase modulation, the interfering phase modulation resulting from the control delay is compensated and the relative movement between the intermediate frequency and the filters is reduced, so that narrow band filters can be employed leading to an increase in noise and interference suppression.

SUMMARY OF THE INVENTION

According to the invention, at least one high pass filter is connected to the follow-up branch and which only supplies the phase modulator with the control voltage in the higher low frequency range where there is an amplitude increase without inverse modulation. As the low frequency ranges are blocked, the modulation characteristic only has to be linear over a relatively small frequency range. The use of a high pass filter offers the further advantage that the lead inherent in each high pass filter partly compensates for the control delay.

When using several filters and phase compensation preferably downstream or upstream of each individual stage, a substantially exact overall phase compensation can be obtained because the delay to the intermediate frequency between the individual on-line filters and the phase modulators associated therewith is small.

As the phase modulator or modulators have a broad band construction compared with the on-line filters, they have no influence on the nearby selection, but far-off selection increases.

Further developments and improvements of this invention are possible.

DESCRIPTION OF THE DRAWING

Embodiments of the invention are described in greater detail hereinafter relative to the drawings, in which.

DESCRIPTION OF THE PREFERRED EMBODIMENT

Figure 1:
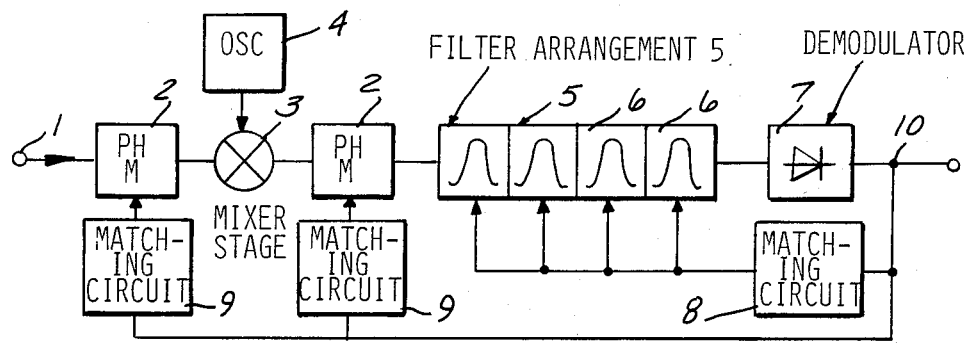
FIG. 1 is a circuit diagram of a first embodiment of this invention in which several on-line filters are followed up and a phase modulator is provided both upstream and downstream of a mixer.

In FIG. 1, reference numeral 1 is the input terminal of the circuit arrangement to which is applied the frequency-modulated incoming signals or the intermediate frequency output signals of an intermediate frequency stage. Reference numeral 2 designates a first and second phase modulator connected to a mixer stage 3, to which are supplied the output signals of an oscillator 4. The output of mixer stage 3 is connected through second phase modulator 2 to a filter arrangement 5 which is formed of several on-line filters 6. Filter arrangement 5 is connected to the input of a demodulator 7, at whose output 10 there are provided the low frequency signals. The latter are returned via a first matching circuit 8 to the filter arrangement 5 and via second and third matching circuits 9 to second and first phase modulators 2, respectively.

The modulated high frequency incoming signals or the intermediate frequency signals pass via the controlled first phase modulator 2 to the mixer stage 3 in which they are mixed with the output signal of the oscillator 4 to form intermediate frequency signals at the mixer stage output. A second phase modulator 2 with a matching circuit 9 is located downstream of the mixer stage 3 corresponding to its band pass range. Hence, one phase modulator 2 is connected ahead of the mixer 3, while the second phase modulator 2 is connected in a feedback control loop between the demodulator 7 and the filter arrangement 5. The filter arrangement 5 filters out the intermediate frequency signals which are in turn demodulated to low frequency signals in the demodulator 7. The low frequency output voltage of the demodulator 7 is supplied to the filter arrangement 5 via the matching circuit 8, which can be constructed as a voltage divider in such a way that the center frequency of each filter 6 follows the instantaneous frequency of the intermediate frequency signal which can be taken from the mixer stage 3. The control signal for the phase modulator 2 is also obtained from the low frequency output signal via a further matching circuit 9. Phase modulator 2 modulates the intermediate frequency at the output of the mixer stage 3 in such a way to compensate for the spurious modulation otherwise present at the output of the filter arrangement 5. For this purpose the modulation superimposed on the intermediate frequency by the phase modulator 2 must be in phase opposition to the interfering phase modulation. The phase opposition can be brought about by an invertor present in the matching circuit 9 which inverts the control signal supplied by the output of the circuit arrangement. In another embodiment, the control elements of the on-line filter 6 used for the detuning of the resonant circuits or for follow-up purposes and which can, for example, be constructed as tuning diodes have an opposite polarity to the control elements of the phase modulator 2 which can also be in the form of tuning diodes.

Figure 4:
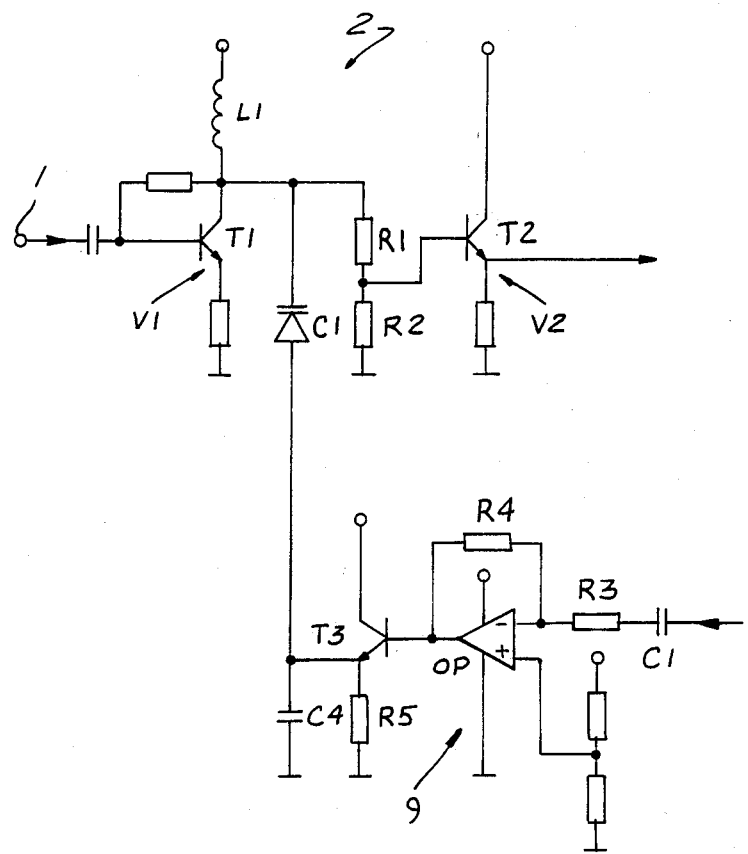
FIG. 4 is the circuit diagram of a phase modulator with matching circuit.

FIG. 4 shows the construction of the phase modulator 2 and the matching circuit 9. The phase modulator 2 is constructed as a single-stage, selective amplifier, whose tuned circuit L1, C1 can be controlled. Control takes place by means of the tuning diodes C1, which are connected to the matching circuit 9. Resistors R1, R2 are used for damping the tuned circuit L1, C1 and for the direct coupling of V1 to the buffer stage V2 containing transistor T2. The matching circuit 9 has an operational amplifier OP, to whose inverting input passes the demodulator 7 output signal 10 via high pass filter R3, C1. The cutoff frequency of R3, C1 is approximately 10 kHz for radio applications. The feedback resistor R4 influencing the amplification of the operational amplifier OP is dimensioned for optimum phase compensation. The necessary low resistance for the intermediate frequency signal is obtained via transistor T3, in conjunction with the emitter coupled R5, C4. The emitter also constitutes a short circuit for the intermediate frequency. The matching circuit 9 may possibly include a, not shown, invertor.

Figure 2:
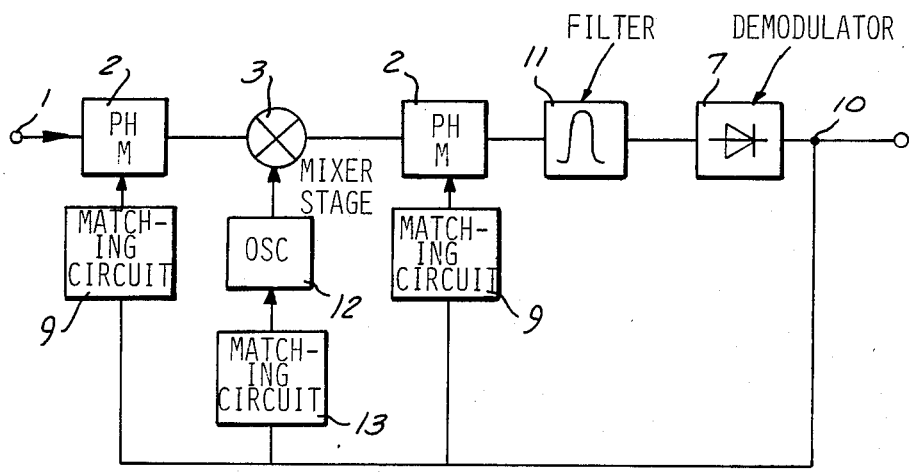
FIG. 2 is the circuit diagram of a second embodiment in which there is a follow-up of the mixer stage oscillator.

FIG. 2 shows a further embodiment where no on-line filter 6 is used, it being replaced by a narrow band selective filter 11, which is not followed up. As in FIG. 1, one phase modulator 2 is connected ahead of the mixer 3 while the second phase modulator 2 is connected in a feedback control loop between the demodulator 7 and the filter 11. Compensating for the interfering phase modulation resulting from the control delay generated in the feedback control loop for controlling the resonant frequency of the filters enables narrow band filters to be employed which leads to an increase in noise and interference suppression over a wider range of frequencies than previously possible. Follow-up in this case takes place by means of an oscillator 12, which is connected across a matching circuit 13 to the output 10 of the demodulator 7 and is so controlled by the control voltage derived from the low frequency output signal 10 that the frequency deviation of the signal at the output of the mixer stage 3 is small. With regards to the opposite phase modulation, the operation corresponds to the construction shown in FIG. 1. However, in FIG. 2, it is the frequency of the oscillator which is frequency modulated and not the frequency of the filters as shown in FIG. 1. FIG. 2 only shows one fixed filter 11, but there can obviously be several such filters. Correspondingly in FIG. 1, more than one on-line filter 6 may be used. In both embodiments, the phase modulator 2 is positioned upstream of the mixer stage 3, but it can also be located downstream thereof.

Figure 3:
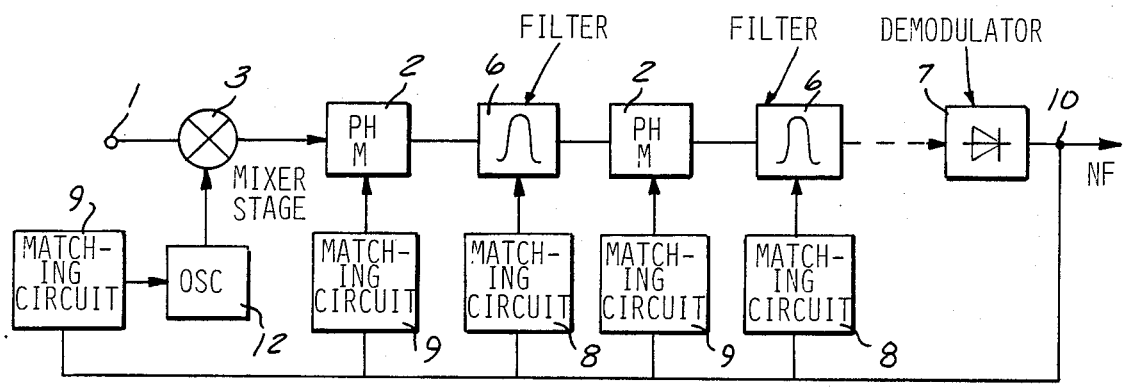
FIG. 3 is a circuit arrangement following the mixer stage, in which phase compensation takes place in stages.

FIG. 3 shows another embodiment in which the modulation in phase opposition to the interfering phase modulation is brought about by the voltage of the oscillator 12 driving the mixer stage 3 which is then superimposed on the intermediate frequency. In this embodiment, several pairs of phase modulators 2 and on-line filters 6 are used. Downstream of the mixer 3, a phase modulator 2 is connected upstream of each on-line filter 6, so that compensation always takes place in several stages.

The phase modulator 2 has a broad band construction compared with the narrow band pass filter 6, so that the far-off selection is improved.

In the described embodiments, the modulation in phase opposition to the interfering phase modulation is brought about by a phase modulator. Another possibility consists of the modulation of the oscillator voltage of the mixer stage and this is then superimposed on the intermediate frequency.

What is claimed is:

1. A filter and demodulator circuit for filtering a frequency-modulated signal carrying a modulation signal comprising:
   an oscillator;
   mixer means, controlled by the oscillator, for converting a first frequency signal into a second frequency signal having a lower intermediate frequency;

controllable filter means, having a resonant frequency and coupled to the mixer means, for narrow band pass filtering of the second frequency signal;

demodulator means, coupled to the filter means, for demodulating the filtered second frequency signal to recover a modulation signal therefrom;

matching circuit means, coupled to the output of the demodulator means, for deriving a control voltage from the modulation signal and for providing the control voltage as an output control signal to another input of the filter means to control the resonant frequency of the filter means; and a first phase modulator means coupled to the filter means and a second phase modulator means connected ahead of the mixer means for modulating the second and first frequency signals, respectively, oppositely in-phase from the interfering phase modulation generated by a control loop delay in passing the signals from the filter means through the demodulator means and the matching circuit means to control the resonant frequency of the filter means.

2. The circuit of claim 1 wherein;
the first phase modulator means includes means for phase modulating the oscillator control voltage of the oscillator.

3. A filter and demodulator circuit for filtering a frequency-modulated signal carrying a modulation signal comprising:
an oscillator;
mixer means, controlled by the oscillator, for converting a first frequency signal into a second frequency signal having a lower intermediate frequency;

fixed selective filter means, having a resonant frequency and coupled to the mixer means for narrow band pass filtering of the second intermediate frequency signal;

demodulator means, coupled to the filter means, for demodulating the filtered second intermediate frequency signal to recover a modulation signal therefrom;

matching circuit means, coupled to the output of the demodulator means, for deriving a control voltage from the modulation signal and for providing the control voltage as an output control signal to another input of the filter means to control the voltage of the oscillator corresponding to the frequency of the intermediate frequency; and a first phase modulator means coupled to the filter means and a second phase modulator means connected ahead of the mixer means for modulating the second and first frequency signals, respectively, oppositely in-phase from the interfering phase modulation generated by a control loop delay in passing the signal from the filter means through the demodulator means and the matching circuit means to control the resonant frequency of the filter means.

4. The circuit of claim 3 wherein:
the first phase modulator means includes means for phase modulating the oscillator control voltage of the oscillator.

* * * * *